United States Patent
Howard, Jr. et al.

(10) Patent No.: US 11,623,522 B2
(45) Date of Patent: Apr. 11, 2023

(54) OVERHEAD DISPLAY SYSTEM FOR VEHICLES

(71) Applicant: Honda Motor Co., Ltd., Tokyo (JP)

(72) Inventors: John F. Howard, Jr., Marysville, OH (US); Carlington G. Demetrius, Dublin, OH (US); Akira Miyazaki, Birmingham, MI (US); Yozo Takagi, Kiyose (JP); Akihiro Shibuya, Tochigi (JP); Fumiyuki Mizuno, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 79 days.

(21) Appl. No.: 17/217,230

(22) Filed: Mar. 30, 2021

(65) Prior Publication Data

US 2022/0314793 A1 Oct. 6, 2022

(51) Int. Cl.
*B60K 35/00* (2006.01)
*B60R 13/02* (2006.01)
*H05K 5/00* (2006.01)

(52) U.S. Cl.
CPC .............. *B60K 35/00* (2013.01); *B60R 13/02* (2013.01); *H05K 5/0017* (2013.01); *B60K 2370/152* (2019.05); *B60K 2370/157* (2019.05); *B60K 2370/771* (2019.05)

(58) Field of Classification Search
CPC .. B60K 35/00; B60K 37/06; B60K 2370/143; B60K 2370/1438; B60K 2370/771; B60R 11/0235; B60R 2011/0028; B60R 2011/0082; B60R 2011/0087; B60R 2011/0294; Y10S 248/917
See application file for complete search history.

(56) References Cited

U.S. PATENT DOCUMENTS

| | | | |
|---|---|---|---|
| 7,460,187 B2 | 12/2008 | Schedivy | |
| 8,363,170 B2 | 1/2013 | Kostepen | |
| 9,584,890 B1 * | 2/2017 | Tuccinardi | B60N 2/879 |
| 10,399,507 B1 | 9/2019 | Yaldo et al. | |
| 2006/0061457 A1 | 3/2006 | Ferguson | |
| 2006/0288385 A1 * | 12/2006 | Vitito | B60R 11/0235 |
| | | | 725/77 |
| 2012/0280542 A1 * | 11/2012 | Wood | B60N 2/879 |
| | | | 297/217.3 |
| 2013/0093967 A1 | 4/2013 | Osborne et al. | |
| 2020/0070736 A1 | 3/2020 | Kim | |

FOREIGN PATENT DOCUMENTS

| | | |
|---|---|---|
| CN | 109367488 A | 2/2019 |
| DE | 19822638 C2 | 6/2000 |
| WO | 2017187066 A1 | 11/2017 |

* cited by examiner

*Primary Examiner* — Nelson M Rosario

(74) *Attorney, Agent, or Firm* — Plumsea Law Group, LLC

(57) ABSTRACT

An overhead display system for a vehicle is disclosed. The system includes a trim panel, a set of brackets, and a plurality of display units. The brackets are disposed within an interior region of the trim panel, and the display units are mounted on the brackets through openings formed in the trim panel. The display units are arranged such that a pair of screens can be oriented in both a rearward-facing direction and a forward-facing direction. The system is configured as a module that can be readily installed in a roof structure of a vehicle.

20 Claims, 14 Drawing Sheets

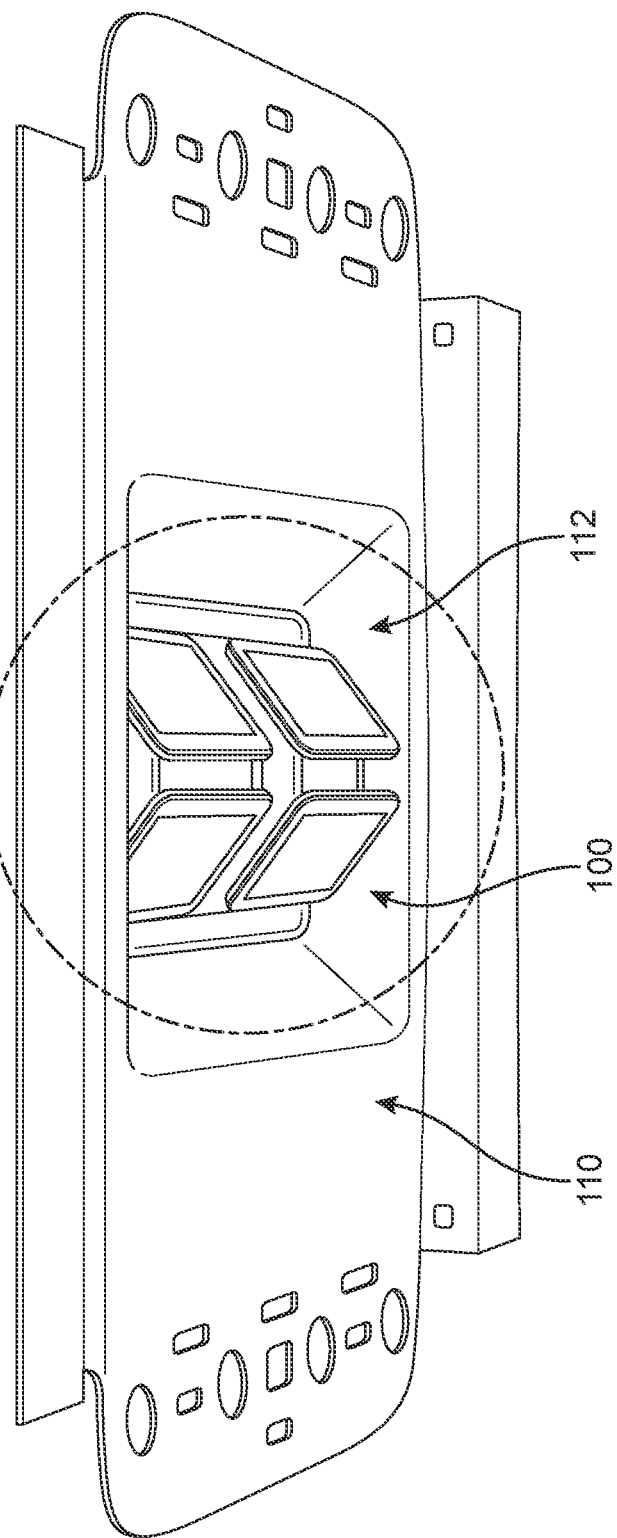

US 11,623,522 B2

OVERHEAD DISPLAY SYSTEM FOR VEHICLES

BACKGROUND

The present disclosure generally relates to airbag systems, and more particularly, to vehicle components that facilitate the deployment of airbag systems.

Display systems are commonly provided in vehicles today, such as in airplanes, buses, and minivans. For example, automotive vehicles may be equipped with various electronic entertainment and information systems, sometimes referred to as infotainment systems. Such displays can offer information and entertainment for passengers, including but not limited to mapping and navigation tools, web browsing, DVD or television playback, and video game systems. The displays are typically mounted on a dashboard of the vehicle or on a rear portion of a seat such as in the headrest or seat back. Such display arrangements are appropriate for conventional vehicles where the vehicle operator and/or passengers are seated in a forward-facing direction.

There is a need in the art for a display system that accommodates non-traditional vehicle seating layouts, in particularly with respect to autonomous vehicles.

SUMMARY

The disclosed embodiments provide methods and systems for an overhead display system in vehicles.

In one aspect, an overhead display system for a vehicle is disclosed. The system includes a mounting assembly including a first bracket, and a trim panel including a first bulging portion. The first bracket is disposed within a hollow first interior region formed in the first bulging portion, where the first interior region is defined in part by a first oblique side and a second oblique side joined together along a nadir portion. The system also includes a first display unit disposed against an outer surface of the first oblique side and a first set of openings formed in the first oblique side. In addition, the first display unit is mounted onto the first bracket through the first set of openings.

Another aspect provides a trim panel of an overhead display system for a vehicle. The trim panel includes body structure or chassis that includes a base portion substantially aligned with a horizontal plane and a first bulging portion that extends downward from the base portion. The first bulging portion includes an internal surface and an external surface, a nadir portion, and a plurality of side portions. The plurality of side portions includes a first oblique side, a second oblique side, a distal side, and a proximal side. In addition, the plurality of side portions each extend in a generally upward direction from the nadir portion. The first bulging portion also includes a substantially hollow interior region formed by the internal surface and partially enclosed by the plurality of side portions and nadir portion. There are also a first set of openings formed in the first oblique side and a second set of openings formed in the second oblique side.

Another aspect provides a method of assembling an overhead display system for a vehicle. The method includes a first step of inserting a first bracket into a first interior space of a first bulging portion of a trim panel, and a second step of positioning a first display unit against a first outer surface of the first bulging portion. A third step includes connecting the first bracket to the first display unit through a first set of openings formed in the first bulging portion.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

BRIEF DESCRIPTION OF THE DRAWINGS

The embodiments can be better understood with reference to the following drawings and description. The components in the figures are not necessarily to scale, emphasis instead being placed upon illustrating the principles of the embodiments. Moreover, in the figures, like reference numerals designate corresponding parts throughout the different views.

FIGS. 1A and 1B present a roof panel in which an overhead display system is installed, according to an embodiment;

DETAILED DESCRIPTION

Figure 1B:
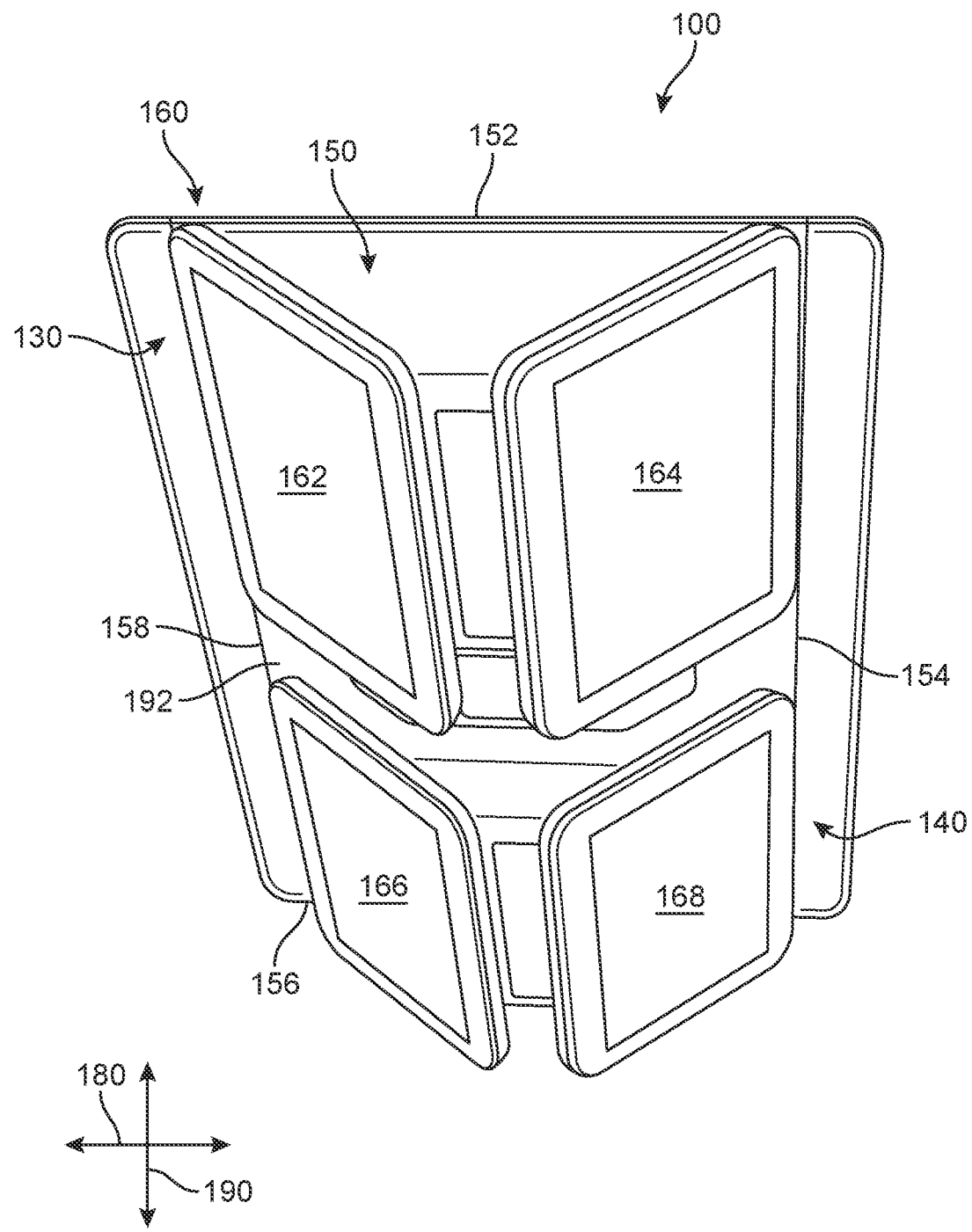

Modern vehicles are increasingly equipped with display apparatuses. Such displays can provide the passengers with information, such as information about a path to a destination from an origin, and information about the current location of the vehicle. In some cases, the display may playback music or video, provide information about the state of the vehicle, or information for user convenience, such as weather and news. In general, conventional vehicle display systems are designed with the standard seating arrangements found in such vehicles. More specifically, vehicles primarily offer forward-facing seats. Thus, the display systems are constructed based on the premise that passengers will be sitting in an upright position and facing forward.

However, vehicles are increasingly developing modifications in passenger seating arrangements. Autonomous driving aims to reduce or completely eliminate a human driver's role in driving a vehicle in order to drastically reduce accidents. Some vehicles, such as those featuring Society of Automotive Engineers (SAE) Level 3+ automated driving capability, will be able to take control of driving, allowing drivers to spend their time in other activities, such as talking to other occupants, listening to song, podcasts or watching videos. When not driving, the drivers may relax by reclining their seats or talking to fellow passengers by swiveling their seat. In fully autonomous (SAE Level 5) vehicles, self-driving system will take full control of driving. With a higher level of automation there is a greater likelihood of unusual interior concept and seat configuration.

Driverless or autonomous vehicles (AVs) may be configured with a passenger compartment including one or more seats that are oriented in various directions. In some cases, the seats can be moved or swiveled from a front-facing position to a rear-facing position for when the vehicle is operating in an autonomous mode. In some other cases, the AV may include a passenger compartment in which the seats are arranged facing toward a center of the vehicle rather than all facing forwards, an arrangement also referred to as "campfire seating". It may be appreciated that such seating arrangements can also make possible the use of a display system that offers forward-facing and rearward-facing passengers viewing access.

Thus, while current display systems generally achieve their intended purpose, there is a need for a new display system that accommodates vehicles designed for passengers who are oriented in the rearward-facing or side-facing position in a vehicle as well as passengers in a forward-facing position. As will be discussed in greater detail below, in some embodiments, an overhead display system can be readily installed in a roof panel of the vehicle. The display system can include mounts for displays that face both forward and rearward. In some embodiments, components of the display system are incorporated into an external trim panel, thereby appearing to extend downward in an aesthetically clean, smooth, and pleasing arrangement to passengers seated below. In addition, in some embodiments, the display system can include a central recessed portion that is preconfigured to receive a drop-in speaker device.

For purposes of introduction, an overview of one embodiment of the proposed systems and methods is illustrated with reference to FIGS. 1A and 1B. In FIG. 1A, for purposes of context, a roof panel 110 is shown in which an overhead vehicle display system ("system") 100 has been installed. In one embodiment, the system 100 is disposed within a sunken region 112 formed in the roof panel 110 itself. In some embodiments, the system 100 comprises a module that may be 'dropped' into an opening formed directly above the sunken region 112 during assembly.

An isolated view of an embodiment of the system 100 is then presented in greater detail in FIG. 1B. It can be seen that system 100 includes a plurality of display units 160. A display unit, for purposes of this application, comprises a display case or housing that is configured to receive and securely retain a display device such as a monitor or other type of screen. In other words, while system 100 includes the structures to mount and hold the displays, it does not necessarily include the display devices (i.e., see FIG. 6). In the examples presented herein, the system 100 includes four display units 160 comprising a first display unit 162, a second display unit 164, a third display unit 166, and a fourth display unit 168. In other embodiments, the system 100 may be configured to include only two display units (e.g., first unit and second unit), or additional display unit pairs can be added that can extend the system a further distance along a direction aligned with the longitudinal axis 190. The display units 160 can include a display case structure for receiving and retaining a display screen.

Furthermore, the display units 160 are secured via brackets (not shown in FIG. 1B) that hold each unit against an external or outer surface 192 of a trim panel 150, where an outer surface refers to the component surface that generally faces out toward the passenger cabin, and an inner surface the component surface that generally faces toward the roof structure. The trim panel 150 provides an overall housing and support structure for the system 100, and may also be referred to as the system chassis. In some embodiments, the trim panel 150 has a generally rectangular cross-sectional shape in the horizontal plane. For example, a base portion (the uppermost portion) of the trim panel 150 comprises a frame shape defined by a first edge 152, a second edge 154, a third edge 156, and a fourth edge 158. In some embodiments, additional components can be mounted on the trim panel 150 to facilitate the installation of the system 100 in the roof structure. For example, a first border panel 130 is joined to trim panel 150 along fourth edge 158 and a second border panel 140 is joined to trim panel 150 along second edge 154. Features of the trim panel 150 will be discussed in greater detail below, for example with reference to FIGS. 7 and 8.

For clarity, the description makes reference to a set of axes. As a general matter, the term "longitudinal axis" as used throughout this detailed description and in the claims refers to an axis that extends in a longitudinal direction, which is a direction extending the length of each component. In the present case, the distance between first edge 152 and third edge 156 is aligned with a longitudinal axis 190. Similarly, the term "lateral axis" as used throughout this detailed description and in the claims refers to an axis that extends in a lateral direction, which is a direction running a width of each component. In the present case, the distance between second edge 154 and fourth edge 158 is aligned with a lateral axis 180. In addition, the term "vertical axis" as used throughout this detailed description and in the claims refers to an axis that extends in a vertical direction, which is a direction running from the roof structure to the floor of a vehicle (see FIG. 2). Each axis of the three axes may be understood to be orthogonal relative to the other two axes.

Furthermore, the description makes reference to distal and proximal directions (or portions). As used herein, the distal direction is a direction outward or oriented away from a center of the system 100. Also, the proximal direction is a direction oriented toward a center of the system 100. Thus, a distal side or region refers to a portion of a component that is disposed further from the center and a proximal side or region refers to a portion of a component that is disposed nearer to the center.

Figure 2:
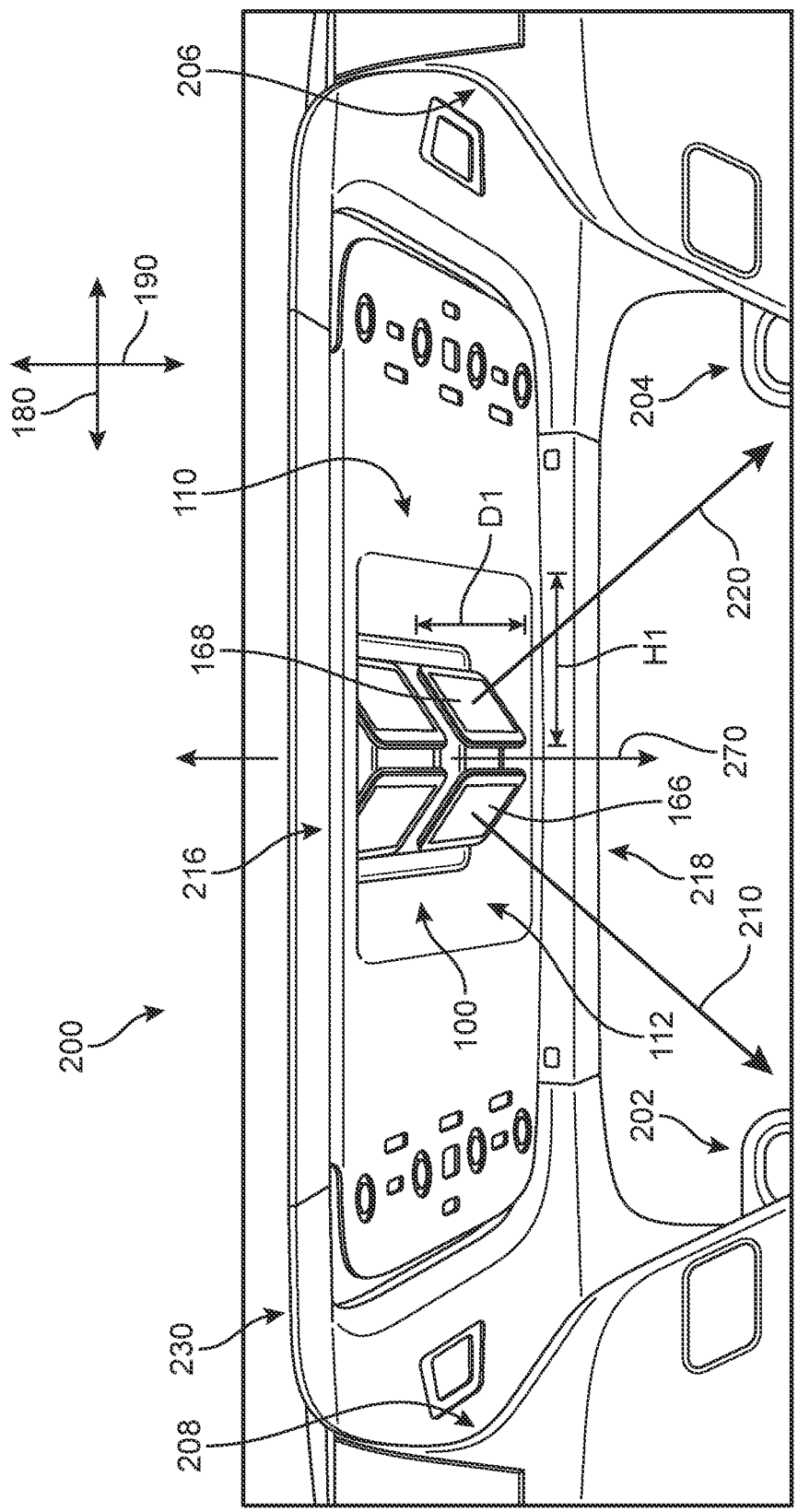
FIG. 2 is a schematic perspective side view of a roof structure for a vehicle including an overhead display system, according to an embodiment.

Referring now to FIG. 2, for purposes of context, the system 100 is illustrated as installed in a roof structure 230 of a vehicle 200. For purposes of this example, the vehicle in which system 100 is installed may be a driver-operated vehicle, a shared autonomous vehicle (SAV), or an autonomous vehicle (AV). In SAVs and AVs, the seating arrangement may allow the vehicle occupants to face each other. As a result, autonomous vehicles may not require components that an individual typically uses to maneuver the vehicle such as, for example, a steering wheel. Moreover, the passenger who is normally seated in the driver's seat may no longer need to be facing forwards towards the front windshield. This is because the occupant seated in the driver's seat no longer needs to view the roadways. As a result, autonomous vehicles can be equipped with flexible seating configurations that allow for the front passengers to rotate their seats into a rearward facing orientation or a side-facing orientation that may be referred to as a campfire style (or a carriage style) seating arrangement of the vehicle.

The vehicle 200 of FIG. 2 is shown in a perspective cutaway view in order to better illustrate the location of system 100 in the vehicle 200 relative to surrounding vehicle structures. The roof structure 230 includes a forward end 208 disposed toward a front of the vehicle 200, and a rearward end 206 disposed toward a rear or back of vehicle, relative to lateral axis 180. In addition, the roof structure 230 extends from a first side 216 to a second side 218 relative to the longitudinal axis 190. The system 100 is incorporated into the roof structure 230 by installation in sunken region 112 of the roof panel 110. In some embodiments, the system 100 can be positioned approximately midway between a rearward-facing seat area 202 and a forward-facing seat area 204.

Furthermore, in different embodiments, the displays can be oriented to accommodate the varied seating arrangement. As shown in FIG. 2 for example, the third display unit 166 (as well as the adjacent first display unit) is tilted or oriented in a first direction 210 to align with a prospective passenger's view in rearward-facing seat area 202 (in this case a diagonally downward and forward direction), while fourth display unit 168 (as well as the adjacent display second unit) is tilted or oriented in a second direction 220 to align with a prospective passenger's view in forward-facing seat area 204 (in this case a diagonally downward and rearward direction). In some embodiments, first direction 210 and second direction 220 can be approximately orthogonal to one another, though in other embodiments, the orientations of the displays can be modified to accommodate other seating arrangements or passenger viewing needs. Furthermore, in some other cases, adjacent displays can be tilted at different angles.

In different embodiments, in order to provide overhead clearance as passengers move through the seating compartment, the system 100 is shaped and dimensioned to be received within the sunken region 112 such that a lowermost portion of each display unit is at or above the level of the surrounding surface of the roof panel. More specifically, in FIG. 2, the lowermost portion of fourth display unit 168 can be seen to be substantially level with a nearby downward-facing surface of roof panel 110 that surrounds the sunken region 112. In some embodiments, a distance D1 from the base of the trim panel to the lowermost portion of the display unit, aligned here with a vertical axis 270, can be substantially similar to the depth of the sunken region 112, allowing passengers to move in the vehicle without 'knocking' into a display unit that protrudes down lower than the ceiling.

Figure 3:
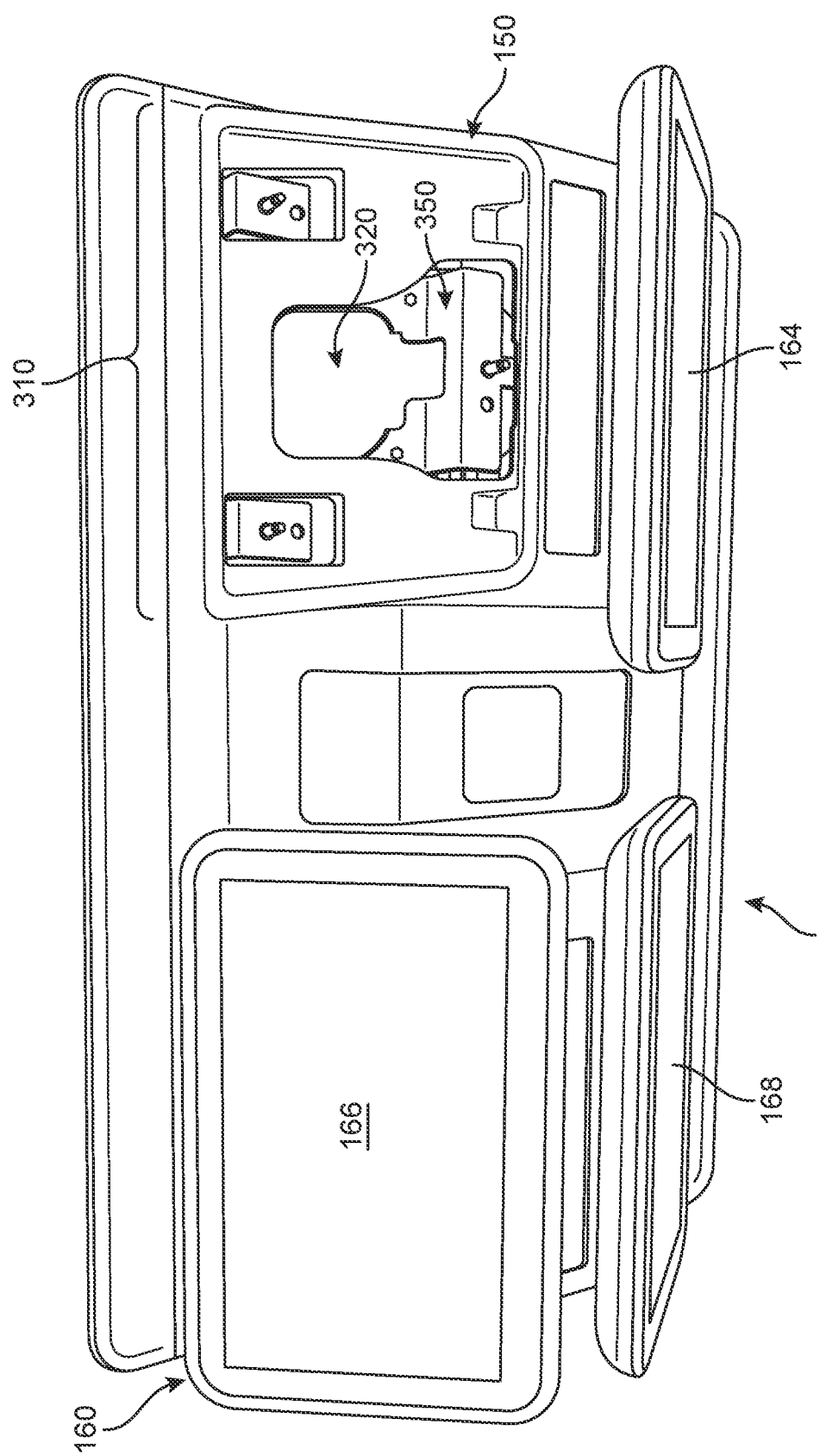
FIG. 3 is a schematic side view of an overhead display system in which one display unit has been removed, according to an embodiment.

Additional details regarding system 100 as a module are now presented with reference to FIGS. 3-6. In FIG. 3, a side view of system 100 is shown. The first display unit has been removed in order to expose a first bracket 350 disposed behind the trim panel 150. In some embodiments, the trim panel 150 includes a plurality of openings 320 that permit portions of the bracket to protrude outward. For purposes of reference, the trim panel 150 can be understood to include a plurality of mounting regions, each configured to receive and secure a display unit. One mounting region 310 is visible where the first display unit has been removed. In FIG. 3, mounting region 310 is substantially rectangular in shape and represents an oblique or tilted side portion of the trim panel 150 (see FIG. 7).

Figure 4:
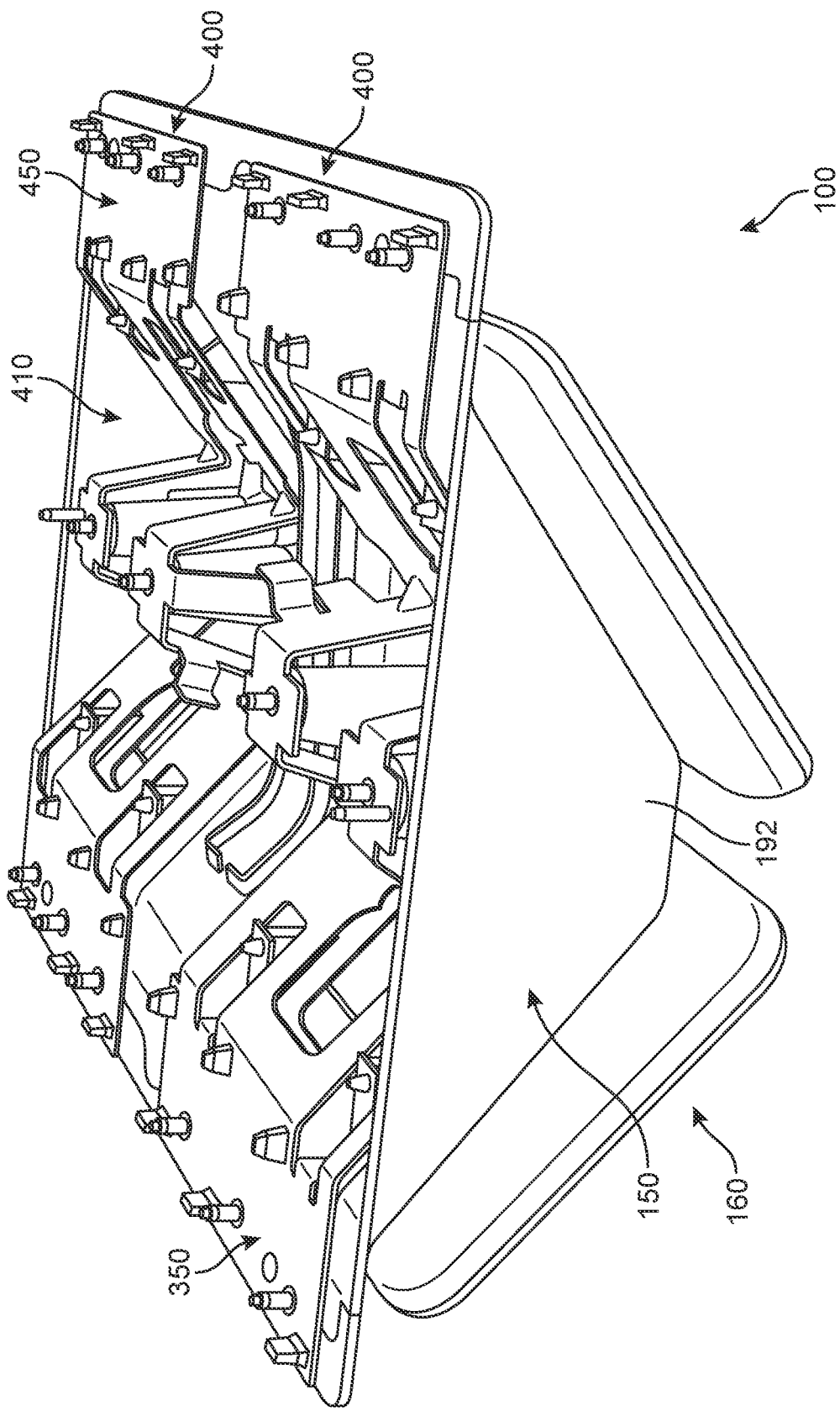
FIG. 4 is a schematic perspective side view of an interior region of the overhead display system, according to an embodiment.

The system 100 is presented in a perspective view in FIG. 4 in order to illustrate an interior compartment 410 of the trim panel 150 that holds mounting assembly 400 comprising first bracket 350 and a second bracket 450. In different embodiments, the first bracket 350 and second bracket 450 are substantially similar components. In some cases, each bracket may include some minor variations relative to the other in order to accommodate assembly and installation processes. FIG. 4 also more clearly illustrates the position of each display unit as it is mounted directly against the outer surface 192 of each mounting region of the trim panel 150.

Figure 5:
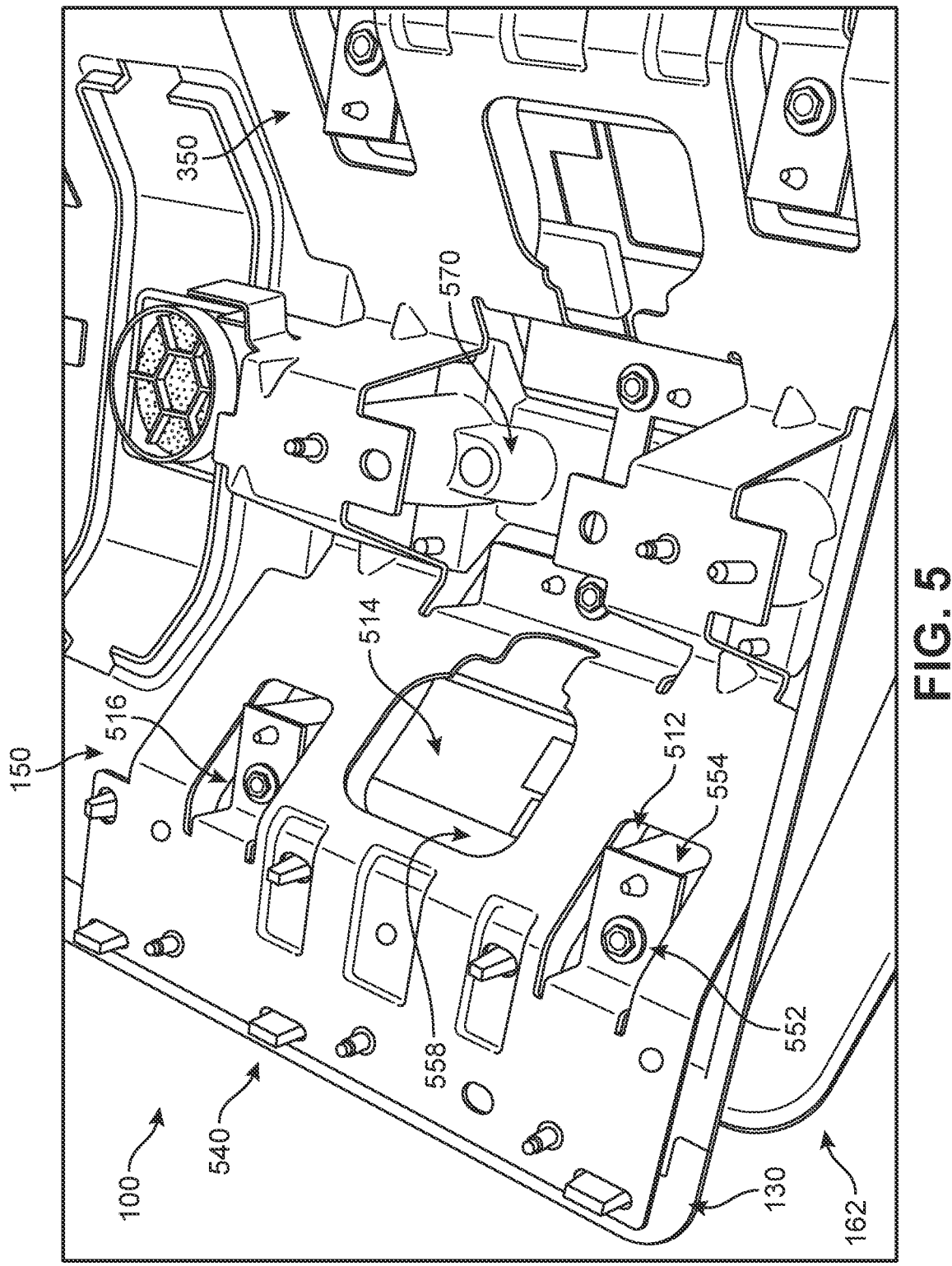
FIG. 5 is a top-down perspective view of an interior region of the overhead display system, according to an embodiment.

A top-down magnified perspective view is provided in FIG. 5. In this view, the fastener or attachment mechanisms for the brackets, trim panel, and display units are more clearly shown, as well as connectors for optional components such as the border panels (e.g., first border panel 130) and a plurality of guide structures 570 (see FIG. 7). Although only the first bracket 350 is shown atop the trim panel 150 in FIG. 5, it should be understood that the second bracket 450 is arranged in a substantially similar manner.

In different embodiments, a plurality of fastener elements ("fasteners") 540 can be used to join various portions of each component of system 100 together to form a single module. Some non-limiting examples of types of fasteners 540 that may be used by system 100 include nuts, bolts, washers, plastic fasteners, metal fasteners, studs, pins, screws, bushings, grommets, rivets, retainers, clips etc. Furthermore, system components can include apertures or holes that permit the passage of a portion of an adjacent component in order to form a connection. For example, a first aperture 512 formed in first bracket 350 accommodates the L-shaped attachment portion 552 that is bolted to a first portion 554 of first display unit 162. A similar second aperture 516 is disposed proximally inward. Between first aperture 512 and second aperture 516 is a larger third aperture 514 in which a rear portion 558 of the first display unit 162 is visible. In some embodiments, the third aperture 514 is configured to allow the connection of tethers and other cables between the display units and the vehicle.

Figure 6:
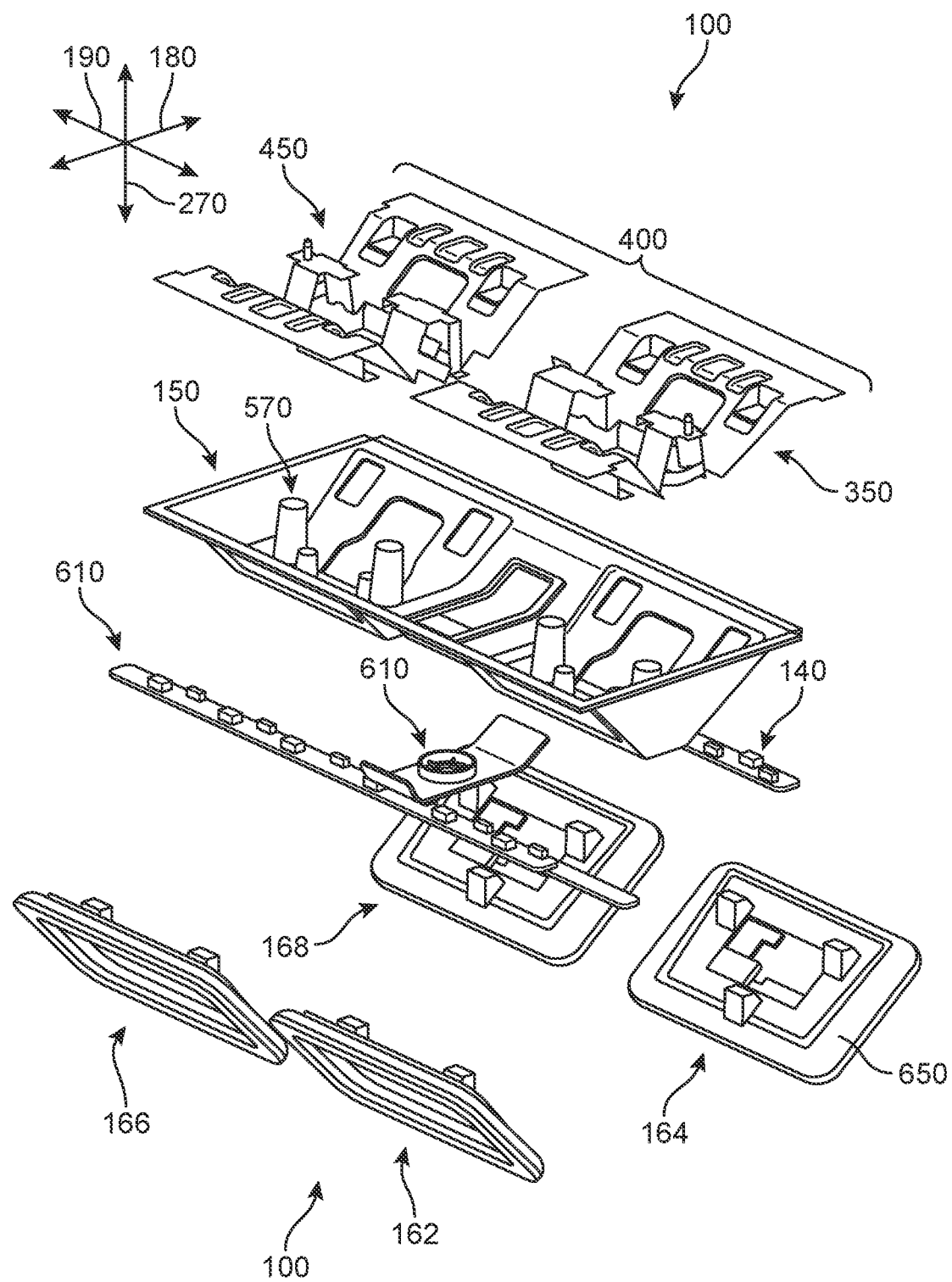
FIG. 6 is a schematic perspective exploded view of the overhead display system, according to an embodiment.

Referring now to FIG. 6, an exploded perspective view of the system 100 is illustrated. The system 100 can be seen to include mounting assembly 400 that comprises a pair of brackets (first bracket 350 and second bracket 450) and corresponds to the system 'layer' that is disposed furthest up relative to vertical axis 270. Directly below mounting assembly 400 is the trim panel 150. In some embodiments, the optional plurality of guide structures 570 are arranged along an approximate longitudinal midline of the trim panel 150. On either side of the trim panel 150 are the optional border panels (first border panel 130 and second border panel 140) as well as an optional central panel 610 that will be discussed further in FIG. 7. Below each of the sides of the trim panel 150 are the display units 160 (first display unit 162, second display unit 164, third display unit 166, and fourth display unit 168). An external housing 650 configured to receive a display is more clearly visible here, where the optional displays have been removed.

Figure 7:
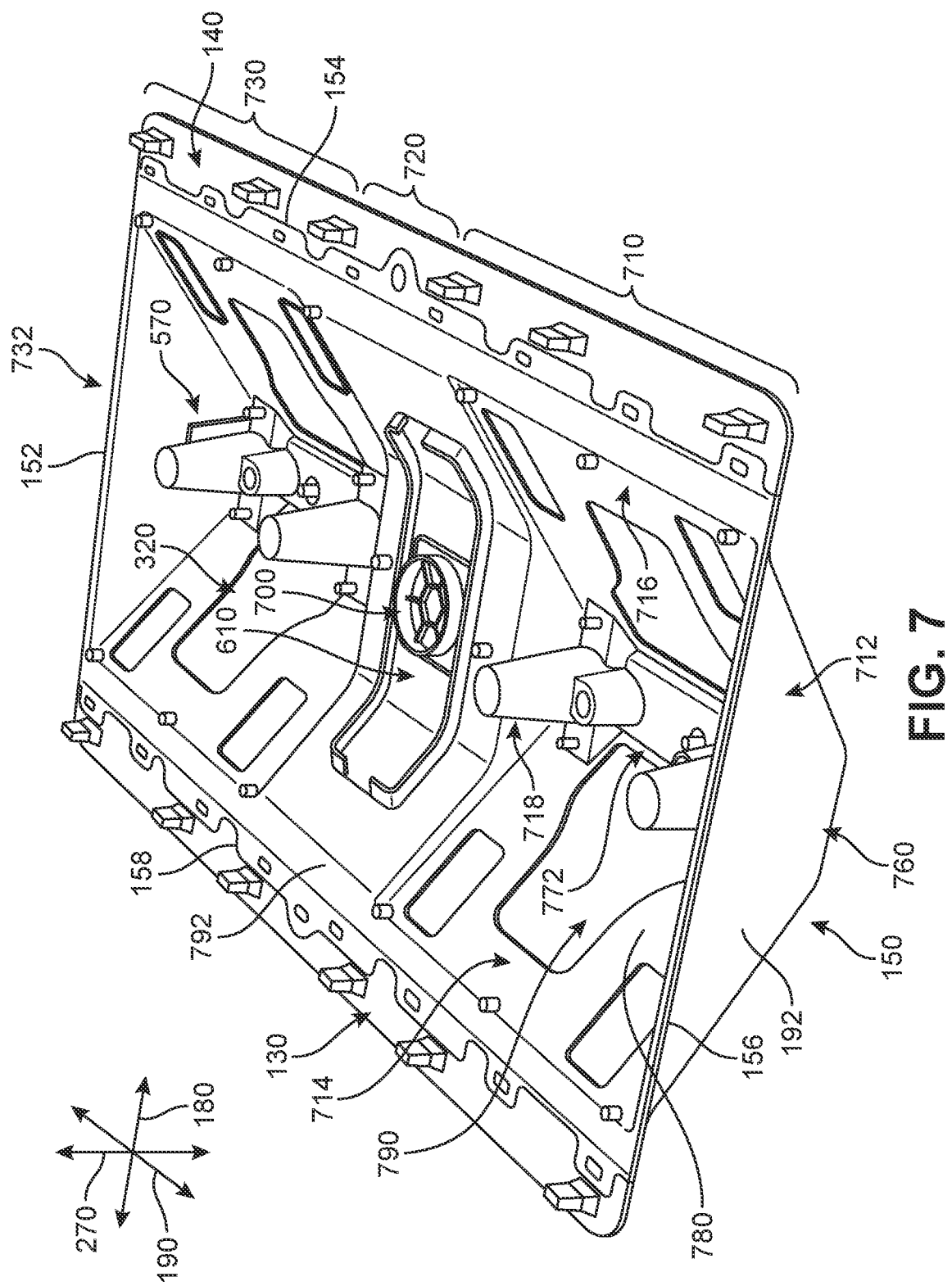
FIG. 7 is a schematic perspective view of an interior region of a trim panel of the overhead display system, according to an embodiment.
Figure 8:
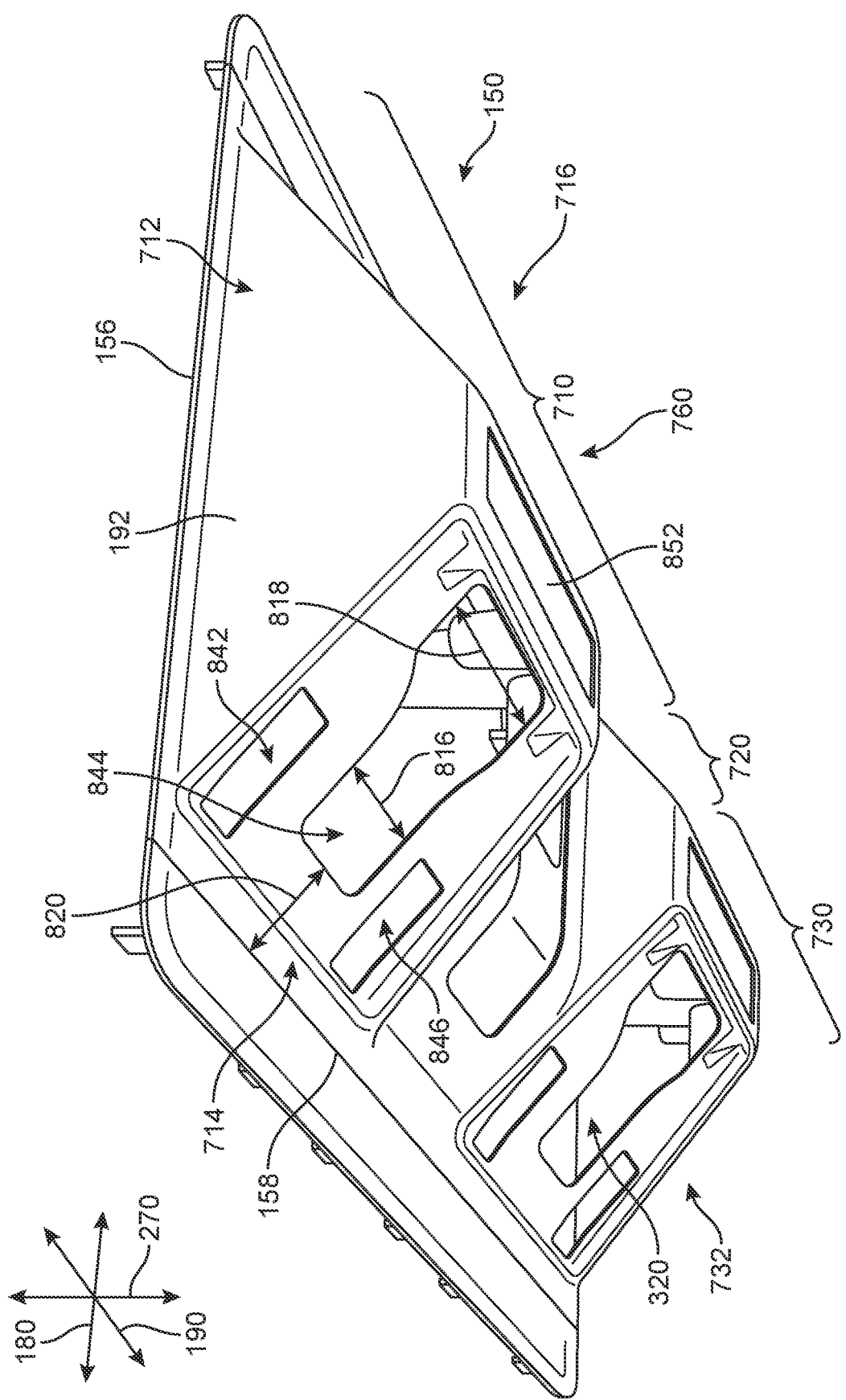
FIG. 8 is a schematic perspective view of an exterior region of the trim panel of the overhead display system, according to an embodiment.

As noted earlier, the trim panel 150 serves as a chassis for the system, providing a supporting structure for the other system components. Additional details regarding the trim panel 150 are now presented with reference to FIGS. 7 and 8 in which trim panel 150 is shown in isolation. FIG. 7 illustrates a perspective top-down view of trim panel 150, exposing an inner surface 792, and FIG. 8 illustrates a perspective bottom-up view of trim panel 150, showing outer surface 192.

In FIG. 7, as identified earlier, trim panel 150 can be seen to include a substantially rectangular base structure that includes first edge 152 aligned with lateral axis 180, second edge 154 aligned with longitudinal axis 190, third edge 156 aligned with lateral axis 180, and fourth edge 158 aligned with longitudinal axis 190. Extending downward in vertical direction 270 from the base are a first bulging portion 710, a second bulging portion 730, and a central recessed portion 720 disposed between and bridging together the first bulging portion 710 and second bulging portion 730. In different embodiments, each bulging portion can include a substantially mound-shaped portion that partially encloses a hollow interior region.

As shown in FIG. 7, first bulging portion 710 includes plurality of side portions that together surround an interior region 790 formed by an inner surface 792 of the trim panel 150, including a first oblique side 714, a second oblique side 716, a distal side 712, and a proximal side 718. Each of the side portions extend in a generally upward direction from a nadir portion 760 that represents the lowermost portion of the trim panel 150 to the base frame. In other words, the substantially hollow interior region 790 is formed by the internal surfaces of each of the plurality of side portions and the nadir portion. In addition, while the nadir portion 760 lies in a plane substantially aligned with a horizontal plane, the oblique sides are sloped or angled as they extend from the base to the nadir portion 760. In one example, an oblique side can be tilted approximately 35-55 degrees relative to the nadir portion 760. It should be appreciated that any changes to the tilt of an oblique side would also correspond to similar modifications to the bracket shape that is inserted into the interior region 790. In some embodiments, the distal side 712 and/or proximal side 718 is oriented approximately in a vertical direction, or generally orthogonal relative to the nadir portion 760.

Furthermore, in some embodiments, a guide structure can be disposed on and secured to the inner surface 792 of one or both of the nadir portions. One example is shown in FIG. 7, where a first guide structure 772 is mounted on nadir portion 760. The first guide structure 772 includes two guides that are configured to facilitate the installation of the system module in the vehicle by providing a centering channel or tunnel through which a fastener mechanism can be directed to a target site.

In addition, in some embodiments, the central recessed portion 720 can include an opening in which a central panel 610 may be inserted and secured. The central panel 610 can be substantially smooth in some embodiments, while in other embodiments the central panel 610 can include modifications to add optional components to the system 100. For example, in FIG. 7, a speaker grill 700 is formed in the central panel 610, providing a mechanism by which a speaker device may be easily installed. 740

Referring to FIG. 8, a view of the outer surface 192 of trim panel 150 is provided. In different embodiments, the trim panel 150 can include provisions for facilitating the connection between the mounting assembly and display units. In FIG. 8, the plurality of openings 320 formed in each of the oblique sides of the trim panel 150 can be more clearly seen. Although only openings formed along first oblique side 714 will be described, it should be understood that each oblique side of the two bulging portions include substantially similar openings. In addition, it should be understood that in some embodiments, the oblique sides and recessed central portion are substantially similar in structure, providing a generally symmetrical component relative to the lateral axis 180.

The first oblique side 714 in this example includes three openings comprising a first opening 842, a second opening 844, and a third opening 846. In some embodiments, each of the first opening 842 and third opening 846 are substantially rectangular in shape and disposed parallel to one another. Furthermore, first opening 842 and third opening 846 are disposed further upward relative to second opening 844, which is disposed adjacent to or abutting the periphery of fourth edge 158.

In contrast, second opening 844 is disposed between the first opening 842 and third opening 846 and has a much larger area, as well as an irregular shape. In one embodiment, second opening 844 is approximately equidistant to both first opening 842 and third opening 846. In some embodiments, second opening 844 is spaced apart by a distance 820 from fourth edge 158, and is instead adjacent to or abutting the periphery of nadir portion 760. In one embodiment, second opening 844 has a narrower region with a first width 816 that is smaller than a second width 818 of a wider region below.

In addition, the first bulging portion 710 along a lateral plane can be observed to have a substantially rounded pyramidal or mound-like shape as it extends from the base to the nadir portion 760. Nadir portion 760 can be seen to include a substantially elongated or rectangular shape. In some embodiments, nadir portion 760 is substantially continuous, planar, or smooth, while in other embodiments, nadir portion 760 includes an aperture in which a lower panel 852 can be installed (forming a substantially planar surface when the panel is smooth). In some embodiments, the lower panel 852 can support the guide structures above and allow for their easy removal or inclusion. While only first bulging portion 710 has been described in detail, it should be understood that second bulging portion 730 includes a substantially similar structure as first bulging portion 710. In addition, it should be understood that the first bulging portion 710 and second bulging portion 730 are substantially similar in structure, providing a generally symmetrical component relative to the longitudinal axis 190.

Figure 9:
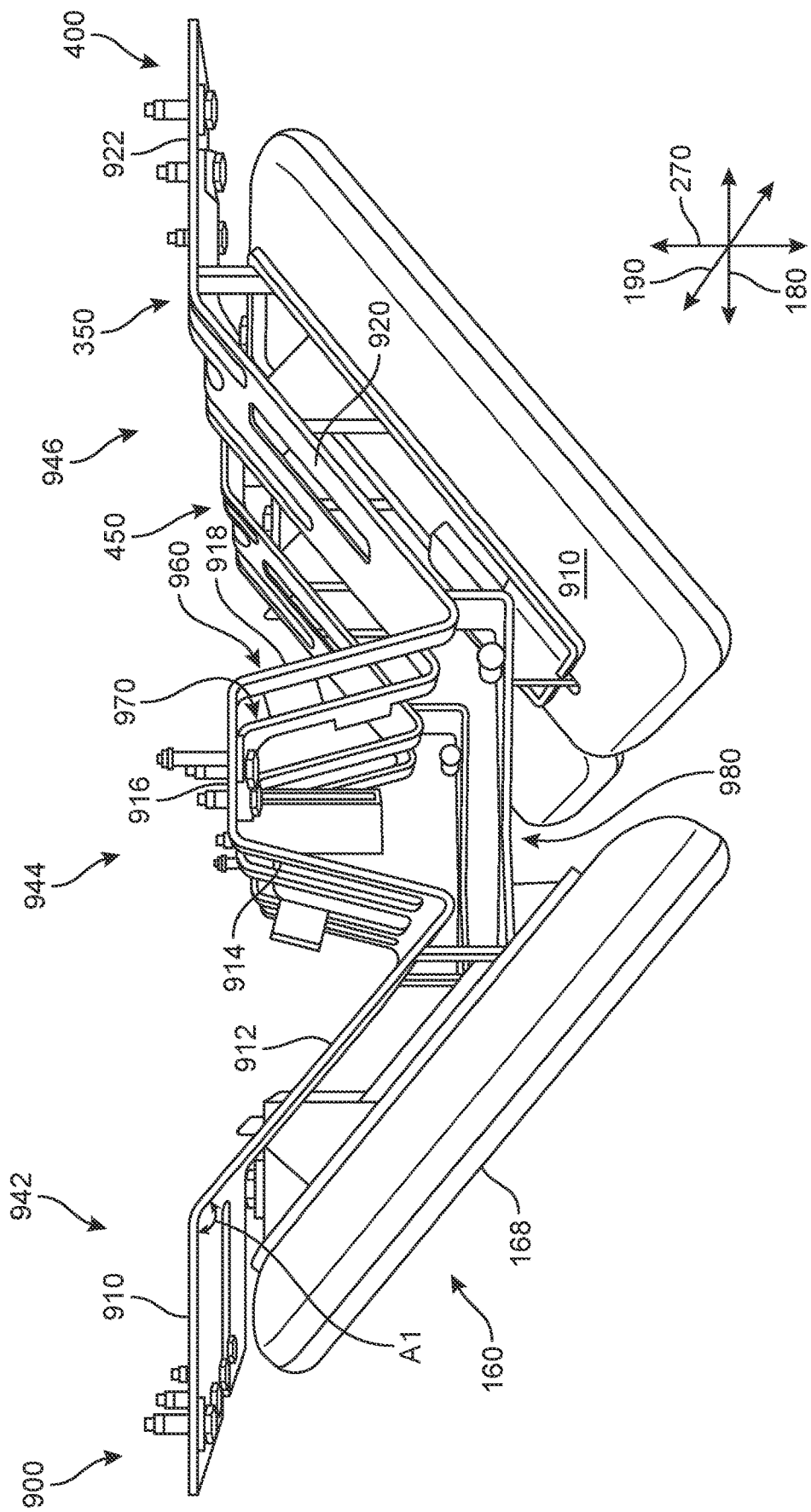
FIG. 9 is a schematic perspective side view of a mounting assembly of the overhead display system to which display units have been secured, according to an embodiment.

As noted earlier, the mounting assembly's two brackets provide an attachment surface for the system, enabling the display units to be secured against the outer surface of the trim panel. Additional details regarding the mounting assembly 400 are now presented with reference to FIGS. 9 and 10 in which the mounting assembly 400 is shown in isolation with display units 160. For purposes of reference, the mounting assembly 400 and attached display units 160 will be collectively referred to as a display mount assembly 900. FIG. 9 illustrates a perspective side view of mounting assembly 400, and FIG. 10 illustrates a perspective top-down view of mounting assembly 400.

In FIG. 9 the lateral-side shape of the brackets can be more clearly observed. Although only the first bracket 350 will be discussed, it should be understood that the second bracket 450 is substantially similar in structure. In this case, first bracket 350 includes a quasi-"W" or generally winged shape, comprising three portions: a first portion 942, a second portion set 944, and a third portion 946. The second portion set 944 is disposed between and bridges together the first portion 942 and third portion 946. In addition, it should be understood that the first portion 942 and third portion 946 are substantially similar in structure, providing a generally symmetrical component relative to the longitudinal axis 190.

The first portion 942 includes a first side 910 and a second side 912 arranged in a quasi-"L" shape (i.e., A1 is an obtuse angle). In addition, the second portion set 944 includes two pieces (960, 970), each with three sides, herein referred to as a third side 914, a fourth side 916, and a fifth side 918 arranged in a "U" shape. The third portion 946 includes a sixth side 920 and a seventh side 922 arranged in a quasi-"L" shape. In addition, extending directly between and connecting the first portion 942 and third portion 946 is a bridge portion 980 that can contact and connect to the guide structures that are disposed below in the trim panel. Similarly, the two pieces of the second portion set 944 are shaped and dimensioned to fit over each guide structure and enable the system module to be installed in the vehicle more quickly and smoothly.

Figure 10:
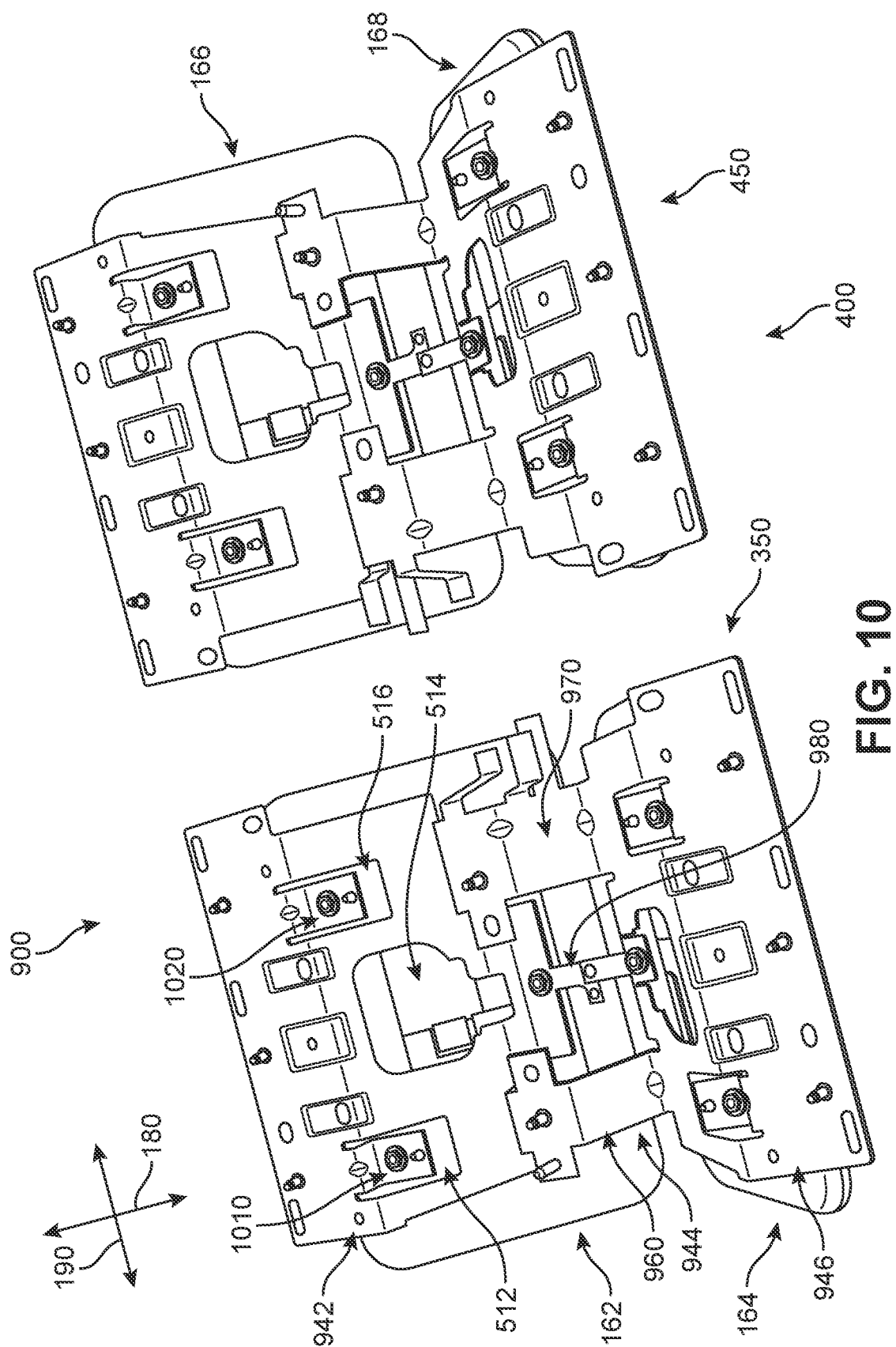
FIG. 10 is a schematic perspective top-down view of the mounting assembly of the overhead display system to which display units have been secured, according to an embodiment.

FIG. 10 presents a view of both brackets (350, 450), better illustrating the apertures formed in the first portion and second portion of each. These apertures—including, for example, first aperture 512, second aperture 514, and third aperture 516 introduced in FIG. 5—are shaped, dimensioned, and arranged to match the arrangement of openings formed in the oblique sides of the trim panel (see FIG. 8). A first attachment portion 1010 extends downward in the first aperture 512 and a second attachment portion 1020 extends downward in the third aperture 516. The alignment between each set of bracket apertures and trim panel openings enables corresponding connection portions extending upward from the display units to be readily joined to the bracket disposed on the opposite side of the trim panel.

Figure 11:
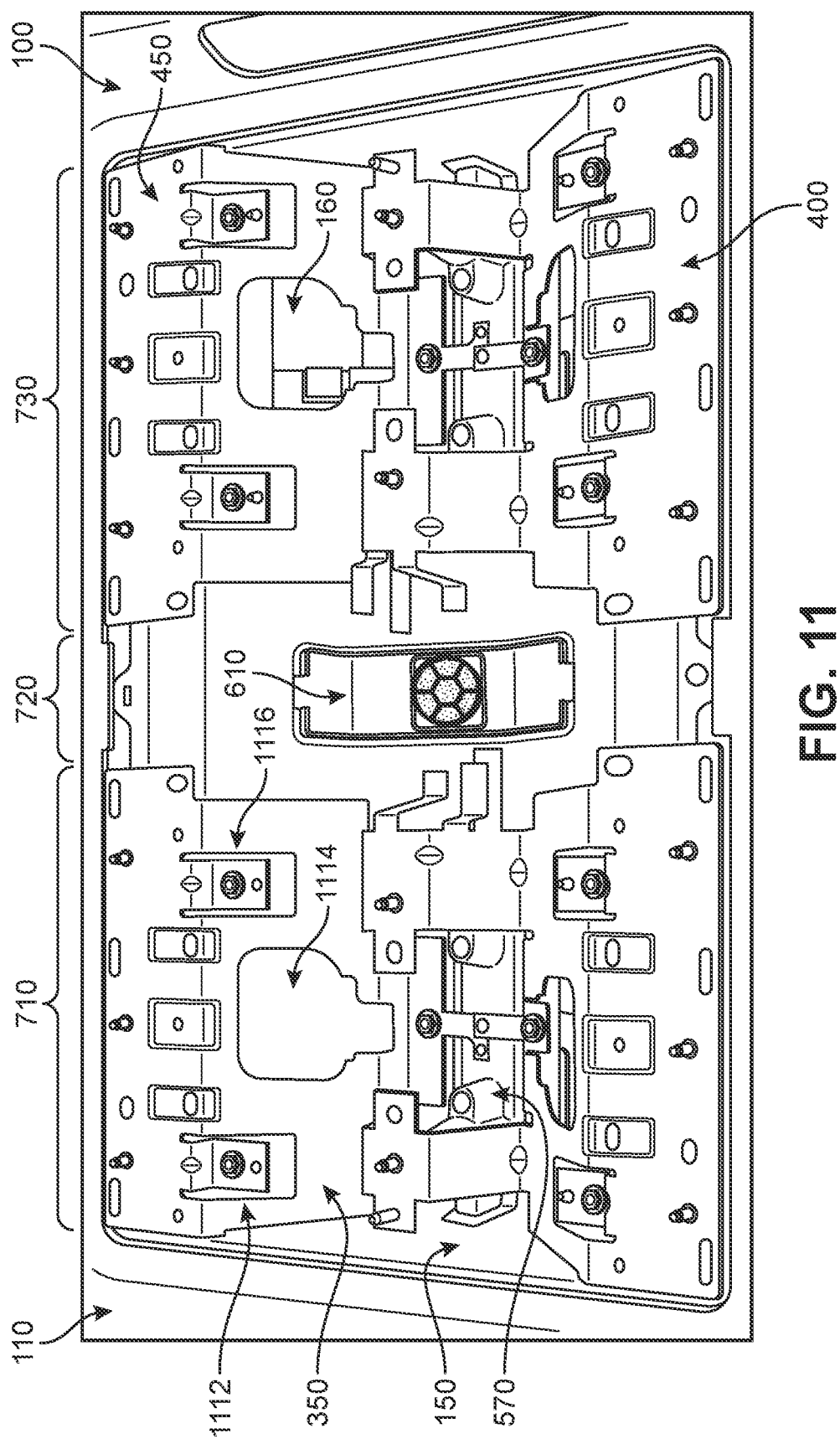
FIG. 11 is a schematic perspective top-down view of the overhead display system as installed in a roof panel, according to an embodiment.

For purposes of clarity, FIG. 11 offers a perspective top-down view of the assembled components of system 100 that have been 'dropped-in' or otherwise installed in roof structure 110. In this view, the alignment of openings and apertures can be more clearly seen. More specifically, alignment of the first opening and first aperture provide a first through-hole passage 1112, alignment of the second opening and second aperture provide a second through-hole passage 1114, and alignment of the third opening and third aperture provide a third through-hole passage 1116.

Figure 12:
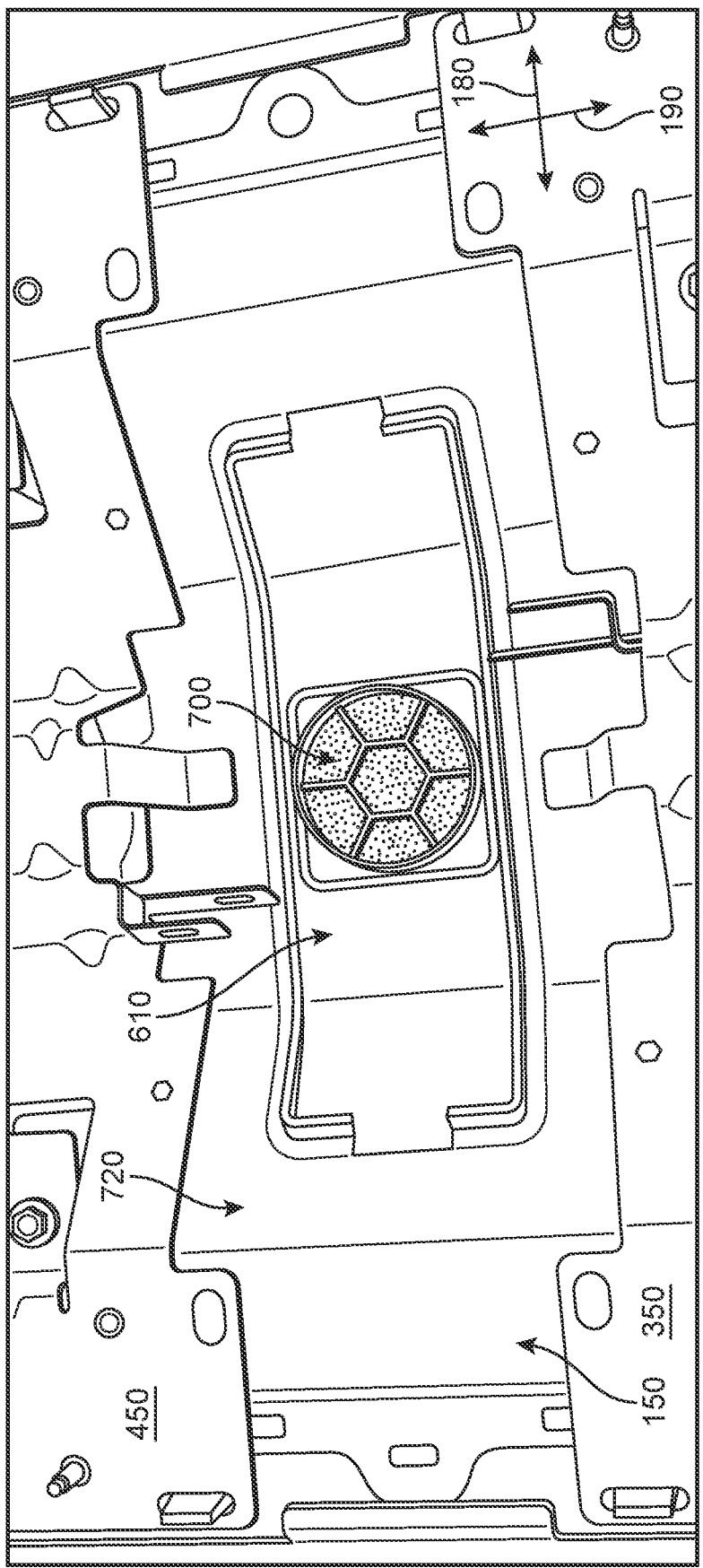
FIG. 12 is a schematic perspective top-down view of a central recessed portion of the trim panel, according to an embodiment.

As noted above, in some embodiments, central recessed portion 720 can include an optional central panel 610. FIG. 12 provides a magnified view of the central panel 610 in which speaker grill 700 has been formed. This view also illustrates how the central recessed portion remains exposed while the two bulging portions are covered by their respective brackets. If desired, a speaker device can be easily installed in the speaker grill 700, for example to operate in conjunction with one or more display unit screens, or to provide an independent speaker system for the vehicle in case of emergency or passenger alerts.

Figure 13:
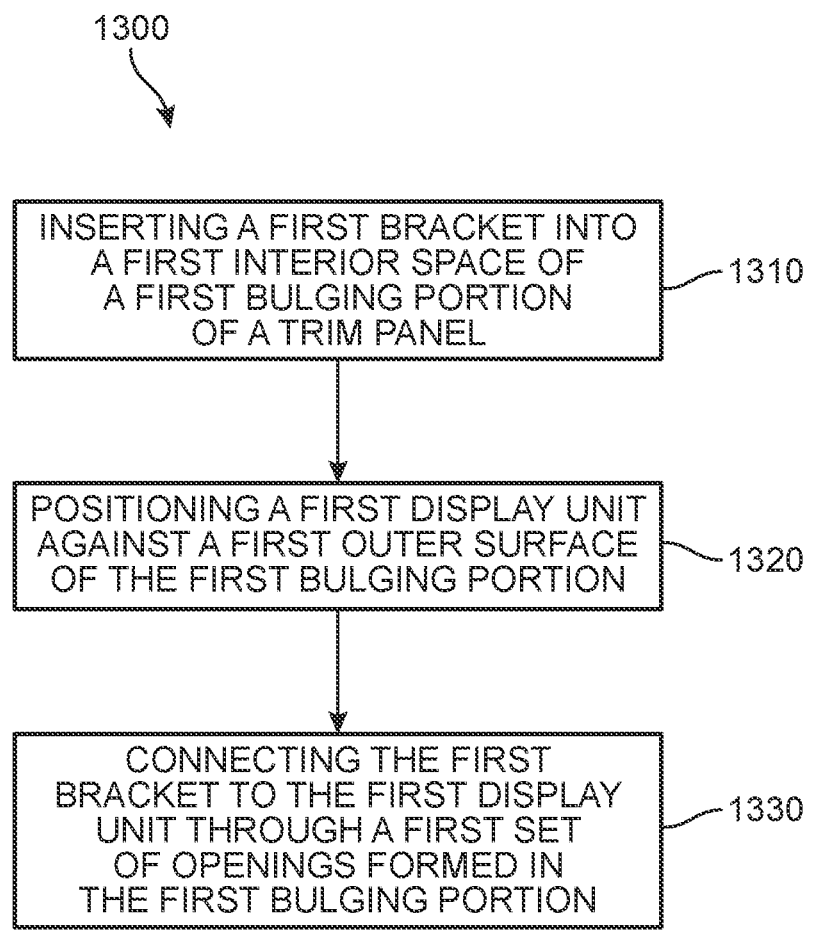
FIG. 13 is a flow diagram of a process of assembling an overhead display system, according to an embodiment.

FIG. 13 is a flow chart illustrating an embodiment of a method 1300 of assembling an overhead display system for a vehicle. The method 1300 includes a first step 1310 of inserting a first bracket into a first interior space of a first bulging portion of a trim panel. A second step 1320 includes positioning a first display unit against a first outer surface (e.g., a mounting region) of the first bulging portion. A third step 1330 includes connecting the first bracket to the first display unit through a first set of openings formed in the first bulging portion.

In other embodiments, the method may include additional steps or aspects. As one example, the method can further include steps of positioning a second display unit against a second outer surface of the first bulging portion, and connecting the first bracket to the second display unit through a second set of openings formed in the first bulging portion such that the first display unit is forward-facing and the second display unit is rearward-facing. As another example, the method can also include steps of inserting a second bracket into a second interior space of a second bulging portion of the trim panel, positioning a second display unit against a second outer surface of the second bulging portion, and connecting the second bracket to the second display unit through a second set of openings formed in the second bulging portion. In some embodiments, the method can also include installing a speaker grill panel into an opening formed in a central recessed portion of the trim panel.

As another example, the proposed embodiments can include an overhead display system for a vehicle. The assembly includes a mounting assembly including a first bracket, and a trim panel including a first bulging portion. The first bracket is disposed within a hollow first interior region formed within or by the internal surfaces of the first bulging portion. The first interior region is defined in part by a first oblique side and a second oblique side joined together along a nadir portion. The first oblique side also includes a first set of openings. The assembly further includes a first display unit disposed against an outer surface of the first oblique side. In addition, the first display unit is mounted onto the first bracket through the first set of openings.

In some embodiments, the system also includes a second display unit disposed against an outer surface of the second oblique side. In one example, the first display unit faces a first direction configured for presentation to rearward-facing vehicle passengers, and the second display unit faces a second direction configured for presentation to forward-facing vehicle passengers. In some cases, the system is shaped and dimensioned to be received in a sunken or recessed region of a roof panel of the vehicle such that a lowermost portion of each display unit is at or above the level of the surrounding surface of the roof panel.

In another example, the trim panel further includes a second bulging portion that is substantially similar to the first bulging portion. In one embodiment, wherein the mounting assembly further includes a second bracket that is substantially similar to the first bracket, and the second bracket is disposed in a hollow second interior region formed in the second bulging portion. In some embodiments, a second display unit is mounted onto the second bracket through a second set of openings formed in the second bulging portion. In different embodiments, the first display unit and the second display unit are oriented along the same direction. In some examples, the first bulging portion and second bulging portion are bridged together in the longitudinal direction by a central recessed portion. In one example, the central recessed portion is configured to receive a speaker device.

As another example, the proposed embodiments can include a trim panel of an overhead display system for a vehicle. The trim panel comprises a chassis or body structure that includes a base portion substantially aligned with a horizontal plane as well as a first bulging portion that extends downward from the base portion. The first bulging portion includes an internal surface and an external surface, a nadir portion, and a plurality of side portions. The plurality of side portions comprises a first oblique side, a second oblique side, a distal side, and a proximal side, where each of the plurality of side portions extend in a generally upward or diagonally upward direction from the nadir portion. The bulging portion also includes a substantially hollow interior region formed by the internal surface and partially enclosed by the plurality of side portions and nadir portion. There are a first set of openings formed in the first oblique side and a second set of openings formed in the second oblique side.

In some embodiments, a lateral cross-section of the first bulging portion is substantially mound-shaped. In another example, the chassis further includes a second bulging portion that is substantially similar to the first bulging portion, and the first bulging portion and second bulging portion are bridged together by a central recessed portion. In one embodiment, the base portion comprises a substantially rectangular frame, and the first bulging portion is disposed adjacent to a first lateral edge of the frame and the second bulging portion is disposed adjacent to a second lateral edge of the frame, where the first lateral edge and second lateral edge corresponding to opposing sides of the frame. in some embodiments, the distal side of the first bulging portion is joined to the first lateral edge, and the proximal side is joined to the central recessed portion. In one example, the central recessed portion includes an elongated opening configured to retain a speaker panel.

The foregoing disclosure of the preferred embodiments has been presented for purposes of illustration and description. It is not intended to be exhaustive or to limit the embodiments to the precise forms disclosed. Many variations and modifications of the embodiments described herein will be apparent to one of ordinary skill in the art in light of the above disclosure.

While various embodiments have been described, the description is intended to be exemplary, rather than limiting, and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims.

Further, in describing representative embodiments, the specification may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the present embodiments.

The invention claimed is:

1. An overhead display system for a vehicle, the assembly comprising:
    a mounting assembly including a first bracket;
    a trim panel including a first bulging portion, the first bracket being disposed within a hollow first interior region formed in the first bulging portion, the first interior region defined in part by a first oblique side and a second oblique side joined together along a nadir portion, the nadir portion representing the lowermost portion of the trim panel relative to a vertical axis running from a roof of the vehicle to a floor of the vehicle;
    a first display unit disposed against an outer surface of the first oblique side; and
    a first set of openings formed in the first oblique side;
    wherein the first display unit is mounted onto the first bracket through the first set of openings.

2. The overhead display system of claim 1, further comprising a second display unit disposed against an outer surface of the second oblique side.

3. The overhead display system of claim 2, wherein the first display unit faces a first direction configured for presentation to rearward-facing vehicle passengers, and the second display unit faces a second direction configured for presentation to forward-facing vehicle passengers.

4. The overhead display system of claim 1, wherein the system is shaped and dimensioned to be received in a recessed region of a roof panel of the vehicle such that a lowermost portion of each display unit is at or above the level of the surrounding surface of the roof panel relative to the vertical axis.

5. The overhead display system of claim 1, wherein the trim panel further includes a second bulging portion that is substantially similar to the first bulging portion.

6. The overhead display system of claim 5, wherein the mounting assembly further includes a second bracket that is substantially similar to the first bracket, and the second bracket is disposed in a hollow second interior region formed in the second bulging portion.

7. The overhead display system of claim 6, wherein a second display unit is mounted onto the second bracket through a second set of openings formed in the second bulging portion.

8. The overhead display system of claim 7, wherein the first display unit and the second display unit are oriented along the same direction.

9. The overhead display system of claim 5, wherein the first bulging portion and second bulging portion are bridged together by a central recessed portion.

10. The overhead display system of claim 9, wherein the central recessed portion is configured to receive a speaker device.

11. A trim panel of an overhead display system for a vehicle, the trim panel comprising:
    a chassis including a base portion substantially aligned with a horizontal plane and a first bulging portion that extends downward from the base portion, the first bulging portion including:
        an internal surface and an external surface;
        a nadir portion representing the lowermost portion of the trim panel relative to a vertical axis running from a roof of the vehicle to a floor of the vehicle;
        a plurality of side portions comprising a first oblique side, a second oblique side, a distal side, and a proximal side, whereby each side portion of the plurality of side portions extends in a generally upward direction from the nadir portion relative to the vertical axis;
        a substantially hollow interior region formed by the internal surface and partially enclosed by the plurality of side portions and nadir portion; and
        a first set of openings formed in the first oblique side and a second set of openings formed in the second oblique side.

12. The trim panel of claim 11, wherein a lateral cross-section of the first bulging portion is substantially mound-shaped.

13. The trim panel of claim 12, wherein the chassis further includes a second bulging portion that is substantially similar to the first bulging portion, and the first bulging portion and second bulging portion are bridged together by a central recessed portion.

14. The trim panel of claim 13, wherein the base portion comprises a substantially rectangular frame, and the first bulging portion is disposed adjacent to a first lateral edge of the frame and the second bulging portion is disposed adjacent to a second lateral edge of the frame, the first lateral edge and second lateral edge corresponding to opposing sides of the frame.

15. The trim panel of claim 14, wherein the distal side of the first bulging portion is joined to the first lateral edge.

16. The trim panel of claim 13, wherein the central recessed portion includes an elongated opening configured to retain a speaker panel.

17. A method of assembling an overhead display system for a vehicle, the method including:
inserting a first bracket into a first interior region formed within a first bulging portion of a trim panel, the first bulging portion including a plurality of side portions that extend in an upward direction from a nadir portion and surround the first interior region, wherein the nadir portion represents the lowermost portion of the trim panel relative to a vertical axis running from a roof of the vehicle to a floor of the vehicle;
positioning a first display unit against a first outer surface of the first bulging portion; and
connecting the first bracket to the first display unit through a first set of openings formed in the first bulging portion.

18. The method of claim 17, further comprising:
positioning a second display unit against a second outer surface of the first bulging portion; and
connecting the first bracket to the second display unit through a second set of openings formed in the first bulging portion such that the first display unit is forward-facing and the second display unit is rearward-facing.

19. The method of claim 17, further comprising:
inserting a second bracket into a second interior space of a second bulging portion of the trim panel;
positioning a second display unit against a second outer surface of the second bulging portion; and
connecting the second bracket to the second display unit through a second set of openings formed in the second bulging portion.

20. The method of claim 17, further comprising installing a speaker grill panel into an opening formed in a central recessed portion of the trim panel.

* * * * *